United States Patent

Chang et al.

[11] Patent Number: 5,438,006
[45] Date of Patent: Aug. 1, 1995

[54] METHOD OF FABRICATING GATE STACK HAVING A REDUCED HEIGHT

[75] Inventors: Chorng-Ping Chang, Union County, N.J.; Kuo-Hua Lee; Chun-Ting Liu, both of Wescosville, Pa.; Ruichen Liu, Warren, N.J.

[73] Assignee: AT&T Corp., Murray Hill, N.J.

[21] Appl. No.: 176,600

[22] Filed: Jan. 3, 1994

[51] Int. Cl.⁶ .......................................... H01L 21/8232
[52] U.S. Cl. ..................................... 437/40; 437/233; 437/246; 437/913; 148/DIG. 105
[58] Field of Search .................. 437/40, 913, 245, 246, 437/233; 156/653; 148/DIG. 105

[56] References Cited

U.S. PATENT DOCUMENTS

| | | | |
|---|---|---|---|
| 4,885,259 | 12/1989 | Osinski et al. | 437/41 |
| 4,886,764 | 12/1989 | Miller et al. | 437/41 |
| 4,971,655 | 11/1990 | Stefano et al. | 156/653 |
| 5,034,348 | 7/1991 | Hartswick et al. | 437/41 |
| 5,094,712 | 3/1992 | Becker et al. | 156/653 |
| 5,302,538 | 4/1994 | Ishikawa et al. | 437/40 |
| 5,346,586 | 9/1994 | Keller | 156/653 |

FOREIGN PATENT DOCUMENTS 1189170   7/1989   Japan ................................. 437/913

*Primary Examiner*—Tom Thomas
*Assistant Examiner*—Michael Trinh

[57] ABSTRACT

An integrated circuit device having reduced-height gate stack is fabricated by using a patterned oxide hard mask to pattern the underlying metal layer. The oxide mask is removed and the patterned metal is subsequently used as a mask to etch the polysilicon layer.

5 Claims, 2 Drawing Sheets

METHOD OF FABRICATING GATE STACK HAVING A REDUCED HEIGHT

FIELD OF THE INVENTION

This invention generally relates to the fabrication of integrated circuits, and more particularly to a method for fabricating multilayer gate stacks in an integrated circuit.

BACKGROUND OF THE INVENTION

A gate stack or multilayer structure is typically used as gate electrodes or interconnects in MOS and CMOS integrated circuits. One gate stack that has been proposed consists of layers of doped polysilicon or amorphous silicon, tungsten silicide ($WSi_2$), and silicon dioxide ($SiO2$). The oxide layer is patterned and used as a hard mask to subsequently etch the underlying polysilicon and silicide layers. After the gate stack is patterned in this manner, the oxide hard mask is retained in the final gate structure. Consequently, the total height of the gate stack includes the height of the oxide mask layer, which contributes as much as 30% to the total height of the gate stack.

The oxide mask layer cannot be removed after the gate stack is patterned since its removal would also thin down the field oxide layer and thus adversely affect isolation between adjacent transistors. Because both the oxide mask and the field oxide layer are oxides, the etching selectivity between them is poor. Thinning down the field oxide layer can also cause significant damage which can result in defects in the integrated circuit.

Different ways of reducing gate-stack height have been attempted, but have not proven to be successful in terms of cost effectiveness as a result of low yield. One approach has involved the use of a BPTEOS hard mask with a special wet etch. One problem with the use of BPTEOS as a hard mask has been an attack on the field oxide layer due to the increase in the wet etch rate during the removal of the hard mask, especially at the edges of the field oxide, where the wet etch rate is especially high. A further problem in this approach is the tendency of boron and phosphorous impurities in the oxide to diffuse rapidly.

Previous proposals to avoid the use of oxide hard mask have failed to control the transistor dimensions with the required precision and suffer from poor linewidth control as a result of deposits formed on the patterned vertical sidewalls. In the larger pattern geometries, deposits of 100 to 200 Angstroms did not present serious problems; however, in the new generation of smaller pattern geometries, the resultant poor linewidth control may result in defective transistors or low yield.

SUMMARY AND OBJECTS OF THE INVENTION

It is an object of the present invention to provide a process of fabricating an integrated circuit with a gate-stack structure having reduced topography.

It is another object of the invention to provide a process for fabricating integrated circuits in which the hard oxide mask of a gate stack structure can be removed by a single and reliable process.

A reduction in the height of a gate stack is achieved in accordance with the present invention by removing the silicon dioxide mask layer, leaving only a metal layer and a polysilicon layer in the final gate stack. The oxide hard mask used to pattern the metal layer may be removed since the polysilicon layer is used to protect the field oxide layer from the etchant used to selectively remove the oxide mask. The etching is completed using the patterned metal as a mask to etch the polysilicon layer down to the gate oxide, without thinning down the field oxide layer. Advantages of the process include reduction of topography, process uniformity, and simplicity as compared to the conventional gate fabrication processes.

BRIEF SUMMARY OF THE DRAWINGS

The foregoing features of the present invention can be more fully understood from the following detailed description of a specific illustrative embodiment thereof, presented hereinbelow in conjunction with the accompanying drawing, in which.

DETAILED DESCRIPTION OF THE INVENTION

Figure 1:
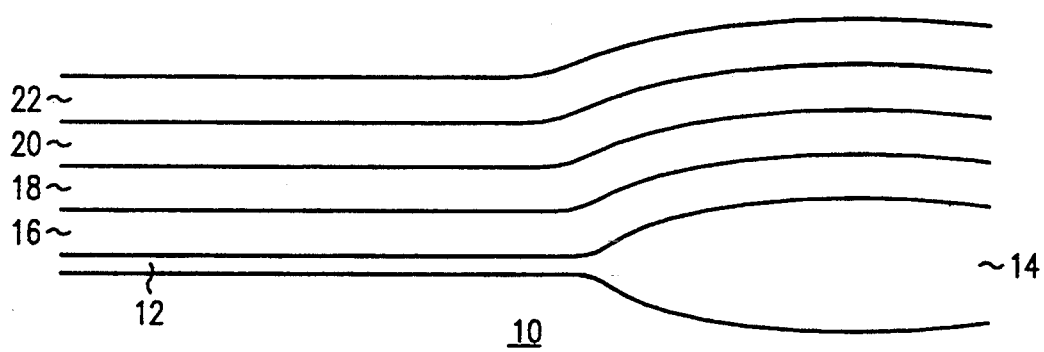
FIGS. 1-4 illustrate cross-sectional views of an integrated circuit at successive stages of its fabrication in accordance with the invention.

Referring to FIG. 1, the fabrication of the gate stack in accordance with the invention begins with a silicon substrate 10 on which is formed, as is conventional, a gate oxide layer 12 and a surrounding field oxide layer 14, the latter providing isolation between adjacent transistors. A layer of doped polysilicon 16 or amorphous silicon is formed over the oxide layers 12, 14 and a refractory metal layer 18 such as of tungsten silicide ($WSi_2$) or titanium nitride (TiN) silicide is formed over polysilicon layer 16. A silicon dioxide layer 20 is formed over metal layer 18 and a layer of photoresist 22 is formed over the oxide layer 20. Layers 16 and 18 and 20 may each be about 1000 Å in thickness.

Figure 2:
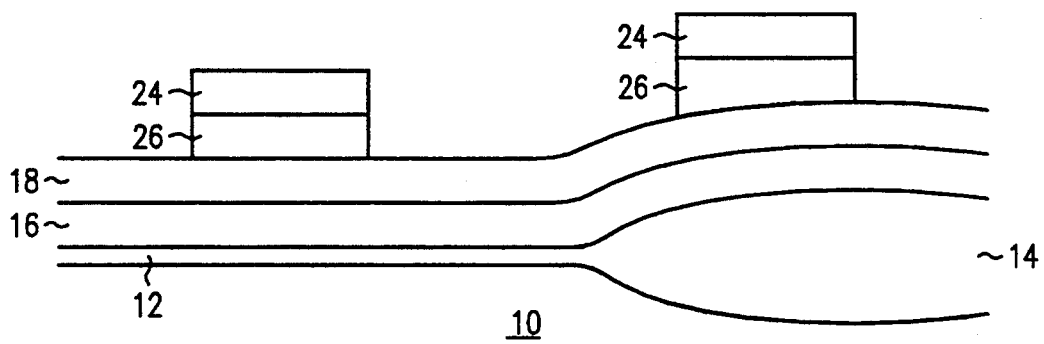

Next, as shown in FIG. 2, as is conventional, the photoresist layer 22 is patterned by a photolithograph process to form photoresist masks 24, and the underlying silicon oxide layer 20 is etched away to leave a patterned layer 26 of silicon dioxide beneath the patterned photoresist 24.

Figure 3:
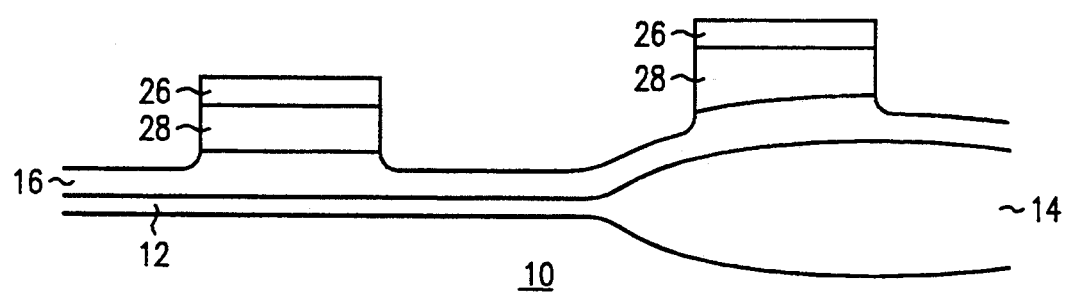

Thereafter, as shown in FIG. 3, the photoresist masks 24 are removed in a conventional manner. In accordance with the present invention, the now-exposed patterned oxide layer 26 is employed as a hard mask to etch away the exposed metal layer 18 to leave a patterned layer of metal 28, and also partly to etch away the exposed polysilicon layer 16.

If the metal layer and the polysilicon layer have significant etching selectivity, etching the metal layer can stop upon reaching the upper surface of the polysilicon layer. A portion of the polysilicon layer 16 will be etched away by an amount determined by the etching selectivity.

Figure 4:
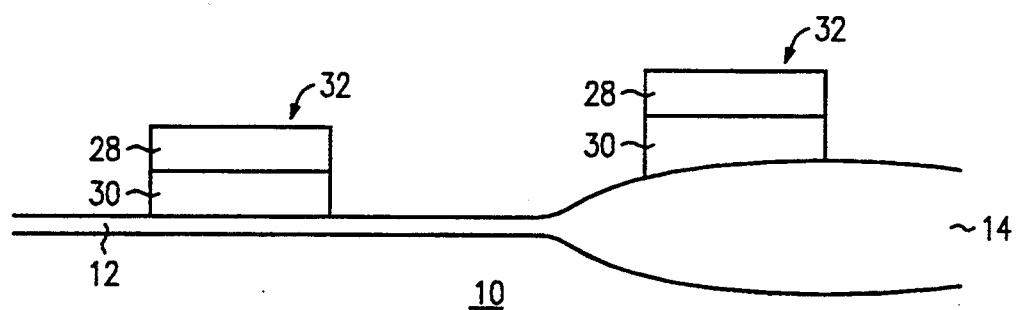

Following the selective etching of the metal layer, the oxide hard mask 24 is removed completely by a known technique, as shown in FIG. 4, which may include either dry etching or wet etching. During the removal of the hard mask, the remaining polysilicon layer 16 is of sufficient thickness to protect the field oxide layer 14 from the etchant used in this step of the process. The now-exposed patterned metal silicide layer 28 is then used as a hard mask for etching away the remaining polysilicon layer 24, as shown in FIG. 4, to form a patterned polysilicon layer 30 to the gate oxide layer 12. This etching step can be safely performed without attacking the gate and field oxide layers because the etching selectivity of the polysilicon layer to the oxide is high, about 20 to 1.

As shown in FIG. 4, the process produces a gate stack 32, comprising the patterned polysilicon layer 30 and the patterned metal layer 28, as opposed to a conventional gate stack, which also includes an overlying oxide layer. The gate stack fabricated in this manner simplifies the back-end process of wiring and the like as a result of the reduced height of the gate stack. The gate stack, as shown in FIG. 4, may constitute the gate electrode of an MOS transistor or an interconnect located in the field region.

The above-described process is merely illustrative of the principles of the present invention. Numerous modifications and adaptations thereof will be readily apparent to those of ordinary skill in this art without necessarily departing from the spirit and scope of the present invention.

What is claimed is:

1. A process of fabricating a gate stack in an integrated circuit including the steps of:
   a) forming a polysilicon layer on a substrate,
   b) forming a refractory metal layer over said polysilicon layer,
   c) forming an oxide layer over said metal layer,
   d) forming a photo-resist layer over said oxide layer,
   e) patterning said photoresist layer and said underlying oxide layer,
   f) removing said patterned photoresist,
   g) using said remaining patterned oxide layer as a hard mask, etching away the exposed portion of said metal layer,
   h) removing said oxide hard mask, and
   i) using said patterned metal layer as a mask, etching away the exposed polysilicon layer.

2. The process of claim 1, in which said step of etching the exposed portion of said metal layer also includes the partial etching of the exposed polysilicon layer.

3. The process of claim 1, in which said remaining polysilicon layer acts as an etching mask for the field oxide layer during said step of etching said exposed metal layer.

4. The process of claim 3, wherein said metal layer comprises a metal selected from the group including tungsten silicide and titanium nitride.

5. The process of claim 3, wherein said patterned metal mask and said patterned polysilicon layer underlying said metal form a reduced-height gate stack.

* * * * *